(12) United States Patent
Liffran et al.

(10) Patent No.: US 9,819,146 B2
(45) Date of Patent: Nov. 14, 2017

(54) DEVICE FOR CONTROLLING AT LEAST ONE DIODE

(71) Applicant: BRIGHTLOOP, Paris (FR)

(72) Inventors: Florent Liffran, Paris (FR); Olivier Rabot, Chevilly-Larue (FR)

(73) Assignee: Brightloop, Paris (FR)

( * ) Notice: Subject to any disclaimer, the term of this patent is extended or adjusted under 35 U.S.C. 154(b) by 0 days.

(21) Appl. No.: 14/782,980

(22) PCT Filed: Apr. 10, 2014

(86) PCT No.: PCT/EP2014/057306
§ 371 (c)(1),
(2) Date: Oct. 7, 2015

(87) PCT Pub. No.: WO2014/167068
PCT Pub. Date: Oct. 16, 2014

(65) Prior Publication Data
US 2016/0308330 A1    Oct. 20, 2016

(30) Foreign Application Priority Data

Apr. 10, 2013 (FR) .................................. 13 53242

(51) Int. Cl.
*H03K 3/57* (2006.01)
*H01S 5/042* (2006.01)
*H05K 1/18* (2006.01)
*H05K 1/02* (2006.01)

(52) U.S. Cl.
CPC ............. *H01S 5/0428* (2013.01); *H03K 3/57* (2013.01); *H05K 1/181* (2013.01); *H05K 1/0243* (2013.01); *H05K 2201/0792* (2013.01); *H05K 2201/10015* (2013.01); *H05K 2201/10174* (2013.01); *H05K 2201/10446* (2013.01); *H05K 2201/10545* (2013.01); *Y02P 70/611* (2015.11)

(58) Field of Classification Search
CPC ........... H03K 3/57; H03K 3/53; H01S 5/0428
USPC .............................................. 372/25; 257/532
See application file for complete search history.

(56) References Cited

U.S. PATENT DOCUMENTS

| 5,736,881 A * | 4/1998 | Ortiz ..................... H01S 5/042 323/269 |
| 2004/0090758 A1* | 5/2004 | Horikawa ......... H01L 23/49816 361/782 |
| 2009/0059981 A1* | 3/2009 | Mizusako ............... H01S 5/042 372/38.02 |
| 2011/0043790 A1* | 2/2011 | Komamaki ........ G01M 11/3145 356/73.1 |

* cited by examiner

Primary Examiner — Tuan Nguyen
(74) Attorney, Agent, or Firm — Muncy, Geissler, Olds & Lowe, P.C.

(57) ABSTRACT

The invention concerns a device for controlling at least one diode 2, the control device comprising an electrical card 4 comprising a printed circuit 5 on which the following are mounted: a diode 2, a front component 7 and a storage capacitor 9 connected in such a way as to form a circuit loop 17 extending substantially in a thickness of the electrical card 4.

8 Claims, 3 Drawing Sheets

DEVICE FOR CONTROLLING AT LEAST ONE DIODE

The invention relates to a driver member for driving at least one diode.

BACKGROUND OF THE INVENTION

Laser diodes are being used nowadays in very large numbers and in a very wide variety of applications in various industrial fields. For example, laser diodes are to be found in medical applications (diagnosis, photodynamic therapy, etc.), in the field of telecommunications (emitting optical signals conveyed by optical fiber), in the field of telemetry, etc.

Depending on the application, the power supply current for a laser diode, i.e. the current flowing through the diode between an anode and a cathode thereof, may lie in the range a few milliamps to several hundreds of amps. The laser diode is driven by a driver member that is dimensioned mainly as a function of the power supply current required in the application. In conventional and non-exclusive manner, such a driver member comprises power supply means supplying electrical energy used to power the components of the driver member and to generate the power supply current for the laser diode, a current regulator module adapted to regulate the power supply current for the laser diode, limiter means for limiting the power supply current for the laser diode in order to protect it, and sometimes a photodiode producing current that is substantially proportional to the light intensity generated by the laser diode, and that is used for verifying that the driver member is operating properly, and possibly also for regulating the power supply current for the laser diode, etc.

The energy efficiency of an assembly constituted by a driver member and a laser diode is a parameter of major importance in numerous applications, and in particular in portable applications in which the driver member is powered by a battery of limited capacity. In general, in order to improve the efficiency of such an assembly, attempts are made to improve the internal structure of diodes (e.g. attempts are made to reduce losses of light due to photons being absorbed by free charge carriers so as to reduce the power supply current needed by diodes), or indeed to design current regulator modules that are more efficient.

It is thus possible to improve the efficiency of such an assembly, but such improvement is generally accompanied by expensive development efforts and/or by changes to electrical circuit diagrams that tend to make the driver member more complex.

OBJECT OF THE INVENTION

An object of the invention is to provide a driver member for driving at least one diode that enables the efficiency of an assembly constituted by the driver member and by the diode to be improved significantly, this efficiency improvement not being accompanied by the above-mentioned drawbacks.

SUMMARY OF THE INVENTION

In order to achieve this object, the invention provides a driver member for driving at least one diode, the driver member comprising a circuit card to which the diode is connected, said circuit card comprising a printed circuit having the following mounted thereon:

- a current regulator module adapted to regulate a power supply current passing through the diode, the current regulator module including an "end" component connected in series with the diode; and
- a storage capacitor connected in parallel with the diode and the end component, the storage capacitor being used for storing a certain quantity of power supply electrical energy, the power supply current coming at least in part from this power supply electrical energy;

the diode, the end component, and the storage capacitor being connected in such a manner as to form a circuit loop extending substantially in a thickness of the circuit card.

The loop as formed in this way extends in a plane that is substantially transverse relative to the card and it presents a surface area that is relatively small, thereby reducing the inductance of stray inductor elements in the circuit loop. By reducing the inductance of stray inductor elements in the circuit loop, a reduction is obtained in the input voltage needed across the terminals of the storage capacitor in order to obtain variation in the power supply current for the diode that is sufficiently fast and of sufficient magnitude to ensure that the diode generates light pulses of desired duration and intensity. This increases the efficiency of the assembly constituted by the diode and the driver member, without introducing complex modifications to the electrical circuit diagrams of the driver member and without modifying the diode.

The invention can be better understood in the light of the following description of a particular, non-limiting embodiment of the invention.

BRIEF DESCRIPTION OF THE DRAWINGS

Reference is made to the accompanying drawings, in which.

DETAILED DESCRIPTION OF THE INVENTION

Figure 1:
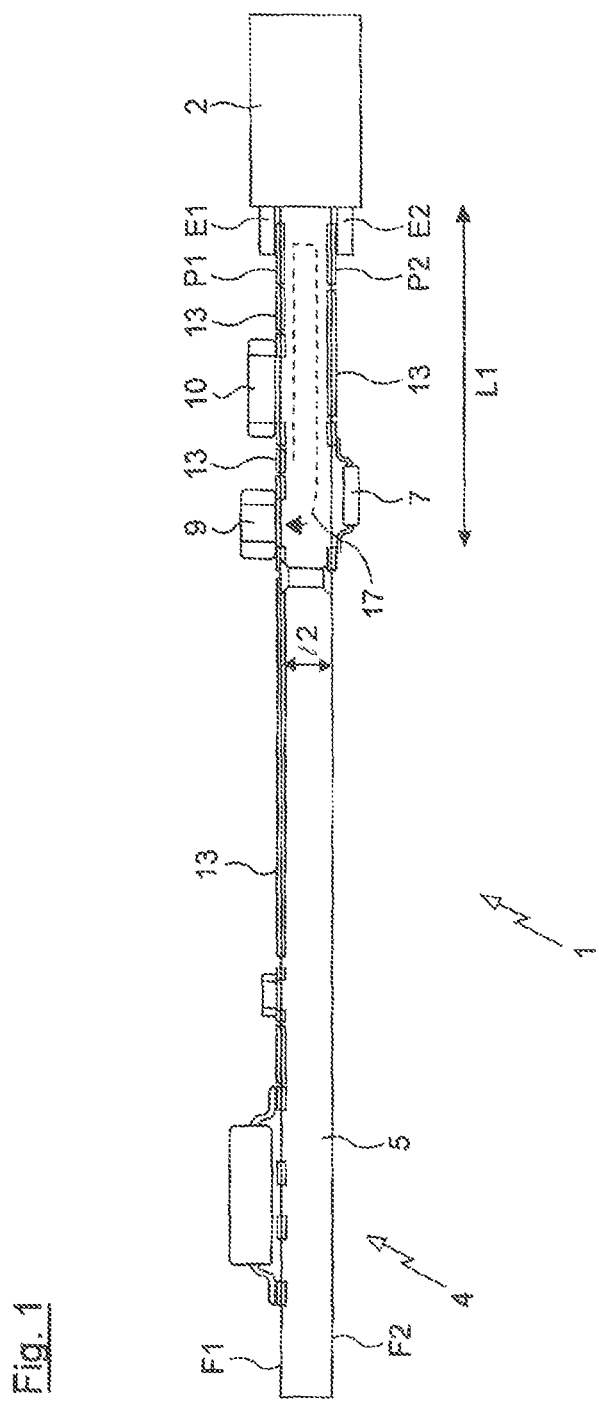
FIG. 1 shows a circuit card of a driver member of the invention.
Figure 2:
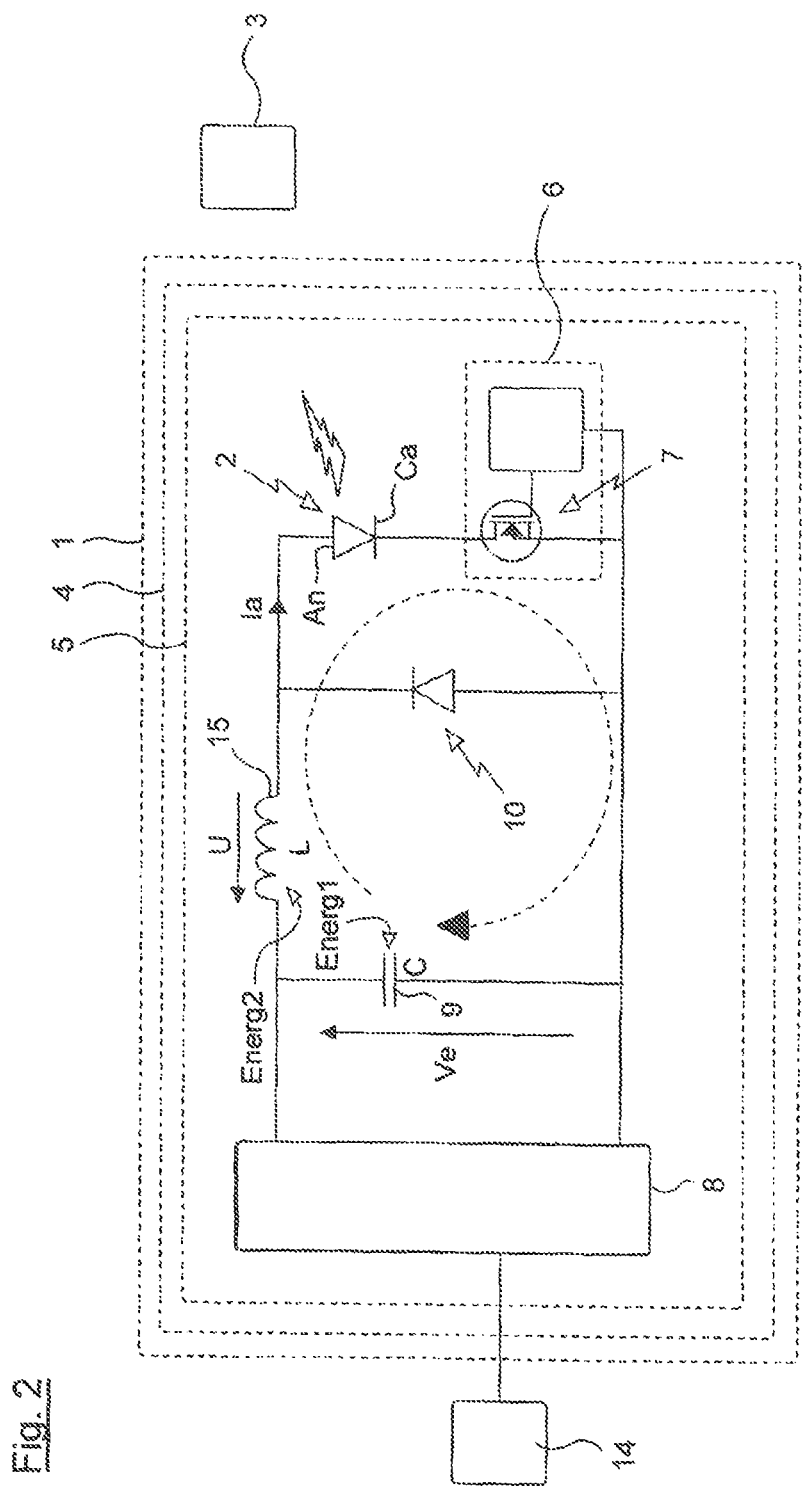
FIG. 2 is a fragmentary electrical circuit diagram of said circuit card.

With reference to FIGS. 1 and 2, the driver member 1 of the invention is adapted to drive a laser diode 2 used for transmitting light signals to an appropriate receiver 3, itself well known and of characteristics that are not described herein. The light signals that the driver member 1 and the laser diode 2 are for producing are very short light pulses of relatively high intensity.

The driver member 1 comprises a circuit card 4 to which the laser diode 2 is connected. The circuit card 4 is constituted by an optionally-varnished printed circuit 5 together with various components mounted on the printed circuit 5. These components include:

- components constituting a current regulator module 6 of the linear regulator type, including an end component, constituted in this example by a transistor 7 of the metal oxide semiconductor field effect transistor (MOSFET) type;
- power supply means 8;
- a storage capacitor 9 (or a plurality of storage capacitors connected in parallel);
- a freewheel diode 10; and various other components including components used for limiting the current flowing through the laser diode, a photodiode, etc.

The laser diode 2, the linear regulator 6, the transistor 7 of MOSFET type, the power supply means 8, the storage capacitor 9, and the freewheel diode 10 are electrically connected to one another in compliance with the electrical circuit diagram shown in FIG. 2.

In this example, the laser diode 2 is a diode that operates in quasi-continuous wave (QCW) mode. The laser diode 2 has an anode An referred to as the "main" anode and a cathode Ca referred to as the "main" cathode. The main anode and the main cathode are the external anode and cathode junctions of the laser diode 2. The main anode An and the main cathode Ca are connected respectively to a first connection element E1 and to a second connection element E2 of the laser diode 2. The term "connection element" is used herein to mean any conductive element of an electrical component that is suitable for being fastened to a pad of a printed circuit, in particular by soldering, so as to connect the electrical component to the printed circuit. With the laser diode 2, the connection elements E1 and E2 are connection pins or tabs. In this example, the first and second connection elements E1 and E2 of the laser diode 2 are connected respectively to a first pad P1 on a first face F1 of the printed circuit 5 and to a second pad P2 of a second face F2 of the printed circuit 5.

The transistor 7 of the linear regulator 6 is connected in series with the laser diode 2. The role of the linear regulator 6 is to control a power supply current Ia for the laser diode 2 and, more precisely, to ensure that the power supply current Ia possesses characteristics that enable the laser diode 2 to generate the desired light pulses. In this example, the power supply current Ia needs to be constituted by high-current pulses (up to 1000 amps (A)), of very short duration (a few nanoseconds to a few microseconds). The transistor 7 is mounted on the second face F2 of the printed circuit 5.

The power supply means 8, themselves connected to a power supply 14 external to the driver member 1, deliver electrical energy used for powering the components of the driver member 1 and for generating the power supply current Ia for the laser diode 2.

The storage capacitor 9 presents capacitance C and serves to store an amount of electrical power supply energy Energ1 from which the power supply current Ia is derived at least in part (a fraction of the power supply current Ia might possibly come directly from the power supply means 8). The storage capacitor 9 is charged by the power supply means 8 between successive current pulses. It is optionally possible to connect the storage capacitor 9 to a component of the capacitor charger type (not shown) suitable for accelerating the charging of the storage capacitor 9. The storage capacitor 9 is mounted on the first face F1 of the printed circuit 5.

In the circuit diagram of the driver member 1 as shown in FIG. 2, it can be seen that stray inductor elements 15 are present, which are represented by an inductor L having one terminal connected to the storage capacitor 9 and another terminal connected to the freewheel diode 10 and to the laser diode 2. These stray inductor elements 15 are the result of the physical characteristics of the tracks 13 of the printed circuit 5 and of the printed circuit 5 itself.

Although all of the tracks 13 are associated with such stray inductor elements, the stray inductor elements 15 shown are those that have the greatest influence on the operation of the driver member 1 for the laser diode 2.

At the end of a power supply current pulse Ia, the magnitude of the power supply current Ia passes suddenly from a very large value (up to 1000 A) to a value of zero, thereby tending to generate large surge voltages at the terminals of the stray inductor elements 15, which surge voltages might damage the laser diode 2 and the transistor 7. The energy from this surge voltage is the amount of energy Energ2 stored in the stray inductor elements 15. On becoming conductive at the end of the power supply current pulse, the freewheel diode 10 limits the surge voltage and diverts the power supply current Ia to the storage capacitor 9, thus enabling a fraction of the stored energy Energ2 to be recovered. The freewheel diode 10 is mounted on the first face F1 of the printed circuit 5.

As can be seen in FIG. 2, the storage capacitor 9, the laser diode 2, and the transistor 7 are connected to one another so as to form a circuit loop 17 (the term "circuit loop" is used herein to mean a certain set of components and tracks or other conductors interconnecting the components, the set of components being such that each component has two connection elements that are said to be loop elements, with each of the two loop elements of each component being connected to a single loop element of another component of the loop).

The stray inductor elements 15 are thus included in the circuit loop 17.

When designing the driver member 1, it is essential to limit as much as possible the inductance L of the stray inductor elements 15. In application of the relationship $U=L \times dI/dt$ (valid for an inductor coil of zero resistance and thus naturally applicable only very approximately to the present situation), where U is the voltage across the terminals of the stray inductor elements, I is the current flowing through them, which is substantially equal to the power supply current Ia when the freewheel diode 10 is non-conducting, it can be seen that in order to obtain a very large change in the current very quickly without increasing the input voltage Ve across the terminals of the storage capacitor 9 in excessive manner, it is necessary to reduce as much as possible the value of the inductance L.

It is known that in a circuit loop such as the loop 17, the inductance L of the stray inductor elements 15 is substantially proportional to the ratio S/e, where S is the surface area of the loop and e is the thickness of the loop.

Figure 3:
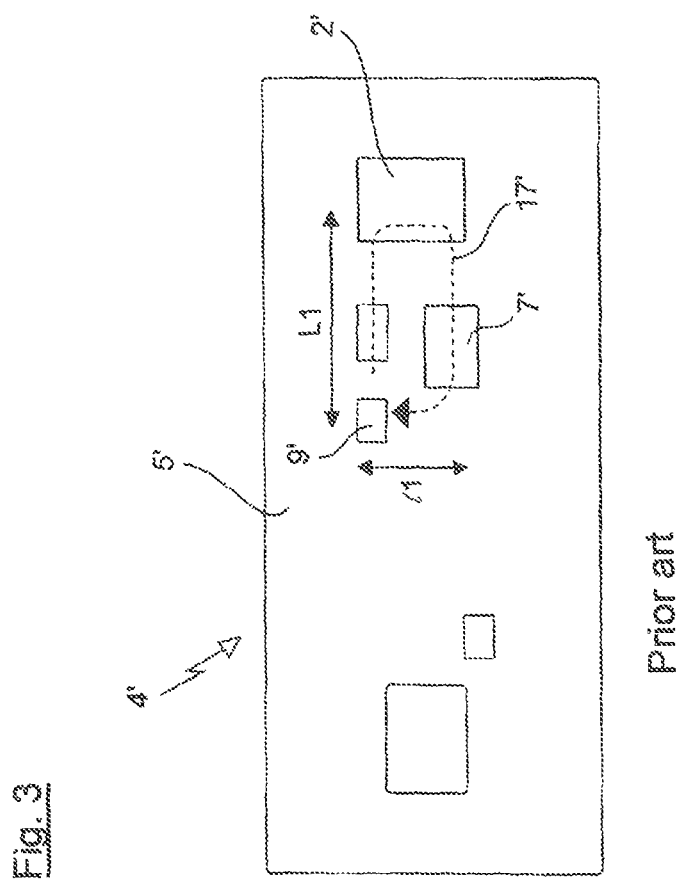
FIG. 3 is a diagram of one face of a printed circuit for a circuit card of a prior art driver member.

In a conventional driver member, having a circuit card 4' as shown diagrammatically in FIG. 3, with a storage capacitor 9', a laser diode 2', and a transistor 7' of a linear regulator all mounted on a common first face F1' of a printed circuit 5', the inductance of the stray inductor elements of a circuit loop 17' formed by these components and these tracks is proportional to S'/e', i.e. L1×l1/e1, where L1 and l1 are respectively the length and the width of a rectangular area of the printed circuit 5' on which the above-mentioned components are mounted, and e1 is the thickness of the tracks of the printed circuit. The circuit loop 17' in this example lies in a plane parallel to the surface of the circuit card 4'. It is considered that the width of a connection element of the laser diode 7' is a good estimate for l1. The following values are used for evaluating S'/e': L1=3 centimeters (cm); l1=2 cm; and e1=100 micrometers (μm). This gives S'/e'=6 meters (m).

In the driver member 1 of the invention, the laser diode 2, the transistor 7, the storage capacitor 9, and the conductors or tracks interconnecting the components are arranged in such a manner that the circuit loop 17 formed thereby lies in a plane extending substantially transversely to the card, and thus presents an area that is relatively small. In this example, the laser diode 2, the transistor 7, and the storage capacitor 9 are mounted around the printed circuit 5. Advantageously, the storage capacitor 9 is mounted very close to the laser diode 2 and the storage capacitor 9 and the transistor 7 are mounted substantially facing each other across the printed circuit 5.

Assuming that the length of the surface area on which the components are mounted is still equal to L1, this example gives a loop area (visible in FIG. 1) that is proportional to L1×l2/l1, where l2 is the thickness of the printed circuit. The following values are used for evaluating S/e: L1=3 cm; l2=1.6 millimeters (mm); and l1=2 cm. This gives S/e=2.4 mm.

It can thus be seen that the ratio (S'/e')/(S/e) is very large, being equal in this example to 2500: it is thus theoretically possible to reduce the value of the inductance of the first inductor element very greatly. In practice, the improvement obtained is smaller, and it is found that the inductance is commonly reduced by a factor lying in the range 5 to 50.

It should be observed at this point that a reduction in the inductance could also be obtained if the laser diode 2, the transistor 7, and the storage capacitor 9 are all mounted on the same face of the printed circuit 5, providing the tracks or conductors interconnecting these components are arranged in such a manner that the circuit loop 17 as formed in this way lies in a plane extending substantially transversely to the card. For example, the reduction in the inductance is indeed obtained if said components are mounted on the same face and they are connected together in such a manner that the track(s) (or other types of conductor) providing current return are made on the other face.

By greatly reducing this inductance L, the input voltage Ve across the terminals of the storage capacitor 9 that is needed for obtaining the required power supply current Ia is reduced, and the efficiency of the assembly formed by the driver member 1 and the diode 2 is thus increased without modifying the structure of the laser diode 2 and without modifying the electrical circuit diagrams of the driver member 1.

Advantageously, provision is made for dimensioning the storage capacitor 9 so that it presents capacitance C such that the storage capacitor 9 forms a resonant circuit with the stray inductor element 15 of the circuit loop 17. The resonant frequency $f_0$ selected for the resonant circuit is then given by:

$$f_0 = \frac{1}{2\pi\sqrt{LC}} = \frac{1}{2T_0}$$

where L is the inductance of the stray inductor elements 15, C is the capacitance of the storage capacitor 9, and $T_0$ is the mean duration of a current pulse. The resonant frequency $f_0$ is thus substantially equal to the reciprocal of twice the duration of a current pulse.

Thus, at the moment when a power supply current pulse ends and when the freewheel diode 10 starts conducting, the current flowing from the stray inductor element 15 to the storage capacitor 9 via the freewheel diode 10 is at a maximum, thereby serving to optimize charging of the storage capacitor 9, and thus recovery of the stored electrical energy Energ2 contained in the stray inductor element 15.

The recovery of this stored electrical energy Energ2 makes it possible once more to increase the energy efficiency of the driver member.

The invention is not limited to the particular embodiment described above, but on the contrary covers any variant coming within the ambit of the invention as defined by the claims.

Although various numerical values are given, they are naturally given by way of illustration and may be varied considerably in an application implementing the invention.

The driver member of the invention may naturally be used for driving a diode of different technology, and in particular a light-emitting diode (LED). The driver member is also suitable for driving a laser diode or an LED regardless of the wavelength at which the diode emits. It can also be used for driving a plurality of diodes, e.g. connected in series.

Although it is stated that the current regulator module 6 is a linear regulator, i.e. that the transistor 7 is controlled to operate under linear conditions, it is naturally perfectly possible to control the transistor 7 so that it operates under saturated conditions (switching).

The invention claimed is:

1. A driver member for driving at least one diode, the driver member comprising a circuit card to which the diode is connected, said circuit card comprising a printed circuit having the following mounted thereon:
   a current regulator module adapted to regulate a power supply current passing through the diode, the current regulator module including an "end" component connected in series with the diode;
   a storage capacitor connected in parallel with the diode and the end component, the storage capacitor being used for storing a certain quantity of power supply electrical energy, the power supply current coming at least in part from this power supply electrical energy; and
   a stray inductor element connected between the storage capacitor and the diode,
   the diode, the end component, the storage capacitor and the stray inductor element being connected in such a manner as to form a circuit loop extending substantially in a thickness of the circuit card, and thereby forming a resonant circuit,
   wherein a resonance frequency of the resonance circuit is determined from inductance of the stray inductor element and capacitance of the storage capacitor and is substantially equal to reciprocal of twice the duration of a power supply current pulse of the circuit loop, and
   wherein at the moment when the power supply current pulse ends, current flowing from the stray inductor element to the storage capacitor is at a maximum, thereby serving to optimize charging of the storage capacitor, and thus recovery of stored electrical energy contained in the stray inductor element.

2. The driver member according to claim 1, wherein the diode, the end component, and the storage capacitor are distributed on two opposite faces of the circuit card.

3. The driver member according to claim 1, further including a freewheel diode connected in parallel with the storage capacitor, the freewheel diode acting when the regulator module switches off the power supply current, to divert electrical energy stored in stray inductor elements of the circuit loop to the storage capacitor.

4. The driver member according to claim 1, wherein the diode has an anode, a cathode, a first connection element connected to the anode and connected to a first face of the printed circuit, and a second connection element connected to the cathode and connected to the second face of the printed circuit.

5. The driver member according to claim 1, wherein the storage capacitor and the end component are mounted substantially facing each other about the printed circuit.

6. The driver member according to claim 1, wherein the end component of the current regulator module is a transistor controlled under saturated conditions.

7. The driver member according to claim 1, wherein the regulator module is a linear regulator and the end component is a transistor.

8. The driver member according to claim 1, in which the power supply module is adapted to generate power supply current pulses of a certain duration so that the diode emits light pulses, and the resonant circuit presents the resonant frequency that is substantially equal to the reciprocal of twice that certain duration.

\* \* \* \* \*